United States Patent [19]

Saito

[11] Patent Number: 4,808,833
[45] Date of Patent: Feb. 28, 1989

[54] IMAGE SENSORS USING A PHOTO-SENSING ELEMENT ARRAY AND MATRIX WIRES METHODS OF MANUFACTURING SAME

[75] Inventor: Tamio Saito, Tokyo, Japan

[73] Assignee: Kabushiki Kaisha Toshiba, Kawasaki, Japan

[21] Appl. No.: 941,079

[22] Filed: Dec. 12, 1986

[30] Foreign Application Priority Data

Dec. 27, 1985 [JP] Japan .................... 60-294055

[51] Int. Cl.$^4$ ............................. H01J 40/14
[52] U.S. Cl. .................... 250/578; 357/30 H
[58] Field of Search ............ 250/578, 211 J; 357/30 H, 32; 358/213.11, 212, 213.15, 213.18, 213.28

[56] References Cited

U.S. PATENT DOCUMENTS

| 4,288,702 | 9/1981 | Ozawa et al. | 250/578 |
| 4,347,436 | 8/1982 | Fukuda et al. | 250/211 |
| 4,354,104 | 10/1982 | Chikamura et al. | 250/578 |
| 4,591,917 | 5/1986 | Suzuki | 358/213.11 |
| 4,607,168 | 8/1986 | Oritsuki et al. | 250/578 |
| 4,620,058 | 10/1986 | Winterling et al. | 136/258 |
| 4,650,984 | 3/1987 | Furushima et al. | 250/211 |
| 4,660,089 | 4/1987 | Lee | 358/213.11 |
| 4,663,535 | 5/1987 | Nakai et al. | 250/578 |
| 4,665,008 | 5/1987 | Nishiura et al. | 250/578 |
| 4,665,422 | 5/1987 | Hirao et al. | 358/212 |
| 4,672,221 | 6/1987 | Saito et al. | 250/578 |

FOREIGN PATENT DOCUMENTS

| 59-138371 | 8/1984 | Japan . |
| 61-75560 | 4/1986 | Japan . |
| 1559473 | 7/1976 | United Kingdom . |

Primary Examiner—David C. Nelms
Assistant Examiner—Jessie Ruoff
Attorney, Agent, or Firm—Foley & Lardner, Schwartz, Jeffery, Schwaab, Mack, Blumenthal & Evans

[57] ABSTRACT

An image sensor having first wires formed in parallel on a first region of a substrate; a semiconductor layer formed on the first region covering the first wires and on a second region of said substrate; first electrodes arranged in line, connecting to the semiconductor layer of said second region; second electrodes arranged in line and connected to the semiconductor layer of said second region, and second wires extended from the first electrodes, the second wires connecting the first electrodes to said first wires at through holes formed in said semiconductor layer. The second electrodes are formed as a common electrode, and each of the first electrode, together with a portion of the second electrode facing the first electrodes and the semiconductor layer forming a photo-sensing element.

17 Claims, 4 Drawing Sheets

IMAGE SENSORS USING A PHOTO-SENSING ELEMENT ARRAY AND MATRIX WIRES METHODS OF MANUFACTURING SAME

BACKGROUND OF THE INVENTION

The present invention relates to image sensors, in particular to image sensors which use a photo-sensing element array and matrix wires, and methods of manufacturing same.

One form of a long-length image sensor such as the contact type image sensors, makes use of the photoconductive effect. FIG. 1 is an illustration of such an image sensor. On a glass substrate 1, $CdS_{0.2}Se_{0.8}$:Cu layers 2 are arranged in a line shape. Then, electrodes 3, 4 facing each other and wires 5 are made from NiCr-Au layers. The electrodes 3 are formed as common electrodes for each group. After that, a film lead 6 is attached. The number 7 denotes polyimide films.

A fine pattern is difficult to produce on this structure because of the film lead 6, and the inability to accurately attach some, so that this technology is not appropriate to accomplish image sensors having a small width.

FIG. 2 is a diagram showing an image sensor made by the present inventor prior to the instant invention. In FIG. 2, there is illustrated an insulating substrate 21, on which is formed a semiconductor layer 22 such as a hydrogenated amorphous silicon (a—Si:H) layer and opposing electrodes 23 and 24. The electrodes 24 which have portions 24' are common electrodes for each photosensing element. The opposing electrodes 23 extend to form second wires 25. The second wires 25 respectively connect to first wires 26 which are formed parallel to the direction of disposition of the array of elements at the through holes C that are formed at the intersections of the first and second wires 25, 26 in the insulating layer 27 (for example, polyimide, epoxy, or the like).

When light reflected from the surface of a manuscript is to impinge upon the photo-sensing array, the electrical resistance of the elements changes in response to the amount of light incident upon the array. Thus, the image on the manuscript can be read, for example, by successively applying a voltage to the common electrodes 24 and by reading the changes in the resistance as electrical signals through successive scanning of the first wires 26.

However, an image sensor of this configuration has a number of disadvantages as discussed below.

The semiconductor layer 22 is generally formed in band form in the photo-sensing region by a masked plasma CVD method or the like. However, the amount of protrusion in the direction of the width of the semiconductor layer 22 has an unevenness due to nonuniformity of the contact between the mask and the substrate. Since the film thickness at the edge of the protrusion in the semiconductor layer 22 is nonuniform, if the insulating layer 28 is formed in that section in an overlapping manner, the adhesion of the insulating layer 28 is unstable. Therefore, the separation between the semiconductor layer 22 and the insulating layer 28 has to be made sufficiently large in order to avoid overlapping of the insulating layer 28 at the edge section of the semiconductor layer 22, which leads to a large size of the image sensor.

In order to eliminate the above problem, it is conceivable to spread the semiconductor layer 22 on the entire surface of the substrate 21, and subsequently remove areas except for the narrow band photo-sensing region utilizing, for example, a photoresist/etching technique. However, the etching of the semiconductor layer 22 involves the processes of coating of photoresist, exposure, and development of a resist and then removal of the resist, so that these steps become factors resulting in an increase in cost. Moreover, yield will also be reduced due to an increase in the number of required processes.

Furthermore, if the semiconductor layer 22 is first formed, the semiconductor layer 22 will be altered by the action of the etchant in the etching process for the insulating layer 28.

On the other hand, if the semiconductor layer 22 is formed after the formation of the insulating layer 28, it is difficult to form the semiconductor layer 22 with high quality due to the influence of the material for the insulating layer 28. In addition, there is a problem of damaging the insulating layer 28 caused by cleansing solutions such as a mixture of hydrogen peroxide and ammonia which is used for cleansing as a pre-treatment to the formation of the semiconductor layer 22.

Furthermore, in the above approach, the photoconductive layer and the insulating layer are made by different steps. However, it is desired to reduce the manufacturing steps for accomplishing high yield and lower cost.

SUMMARY OF THE INVENTION

Accordingly, an object of the present invention is to provide improved image sensors.

Another object of the invention is to provide improved image sensors having a small width.

A further object of the invention is to provide improved image sensors for accomplishing high reliability.

Yet another object of the invention is to provide improved image sensors for accomplishing high yield.

An additional object of the invention is to provide improved image sensors enabling reduced manufacturing steps.

Still another object of the invention is to provide improved methods of manufacturing image sensors.

In accomplishing the foregoing objects there is provided according to one aspect of the invention an image sensor, comprising:

a substrate;

first wires formed in parallel on a first region of the substrate;

a semiconductor layer continuously formed on said first region covering said first wires and a second region of said substrate;

first electrodes arranged in line, connecting to said semiconductor layer in the second region;

electrode portions arranged in line and electrically connected to said semiconductor layer of said second region, groups of the electrode portions each having a common electrode, and each of the first electrode, the portion of said second electrode facing the first electrode and the semiconductor layer positioned between said first electrode and the portion of the second electrode comprising a photosensing element; and second wires extended from said first electrodes, said second wires connecting the first electrodes to the first wires at through holes formed in the semiconductor layer.

According to another aspect of the invention there is provided an image sensor, comprising:

first wires formed in parallel on a first region of a substrate;

a semiconductor layer continuously formed on said first region and a second region of said substrate, covering said first wires;

a plurality of pair electrodes arranged in line connecting to the semiconductor layer of the second region, each of the pair electrodes and the semiconductor layer positioning between the pair electrode compose a photo-sensing element; and second wires respectively extended from the photosensing element to the first region and contacting the first wires at through holes formed in said semiconductor layer.

Further, there is provided according to another aspect of the invention a method of manufacturing image sensors, comprising the steps of:

(i) forming first wires in parallel on a first region of a substrate;

(ii) forming a semiconductor layer continuously on said first region and a second region of the substrate, covering the first wires, and the semiconductor layer having through holes corresponding to the first wires;

(iii) forming a conductive layer on the semiconductive layer; and (iv) patterning the conductive layer to first electrodes, second electrodes and second wires, the first and second electrodes being each arranged in line, facing each other and connecting to the semiconductor layer of the second region, each of the second electrodes faces a plurality of the first electrodes, the second wires being respectively extended from the first electrodes to the first region and contacting the first wires at the through holes in said semiconductor layer.

BRIEF DESCRIPTION OF THE DRAWINGS

The invention, together with its various features and advantages, will be readily understood from the following more detailed description presented in conjunction with the following drawings, in which:

FIG. 3b is a diagram showing a cross-sectional view along line A—A of FIG. 3a;

DETAILED DESCRIPTION OF THE PREFERRED EMBODIMENTS

Figure 3A:
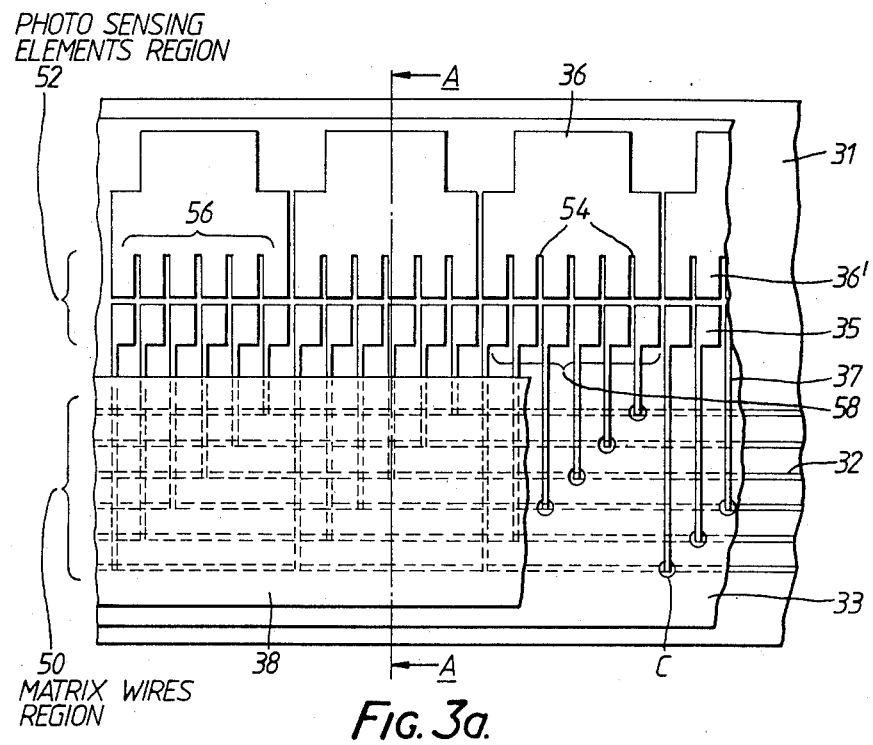
FIG. 3a is a drawing of an image sensor in accordance with a first embodiment of the invention.
Figure 3B:
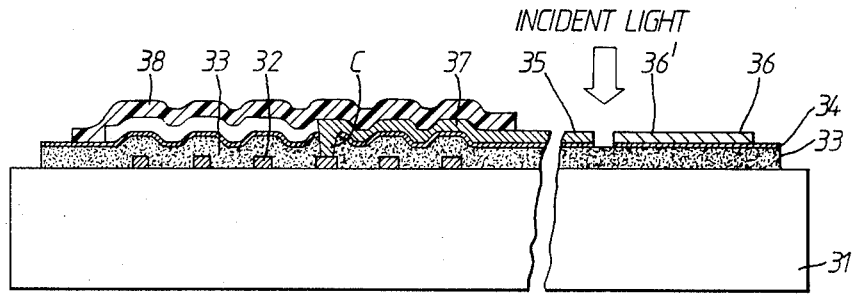

FIG. 3a is a plan view of an embodiment of the image sensor of the present invention and FIG. 3b is a cross-sectional view along line A—A of FIG. 3a.

In the figure, a substrate 31 comprises, for example, an alkali-free glass substrate or a glazed ceramic substrate (i.e., a layer of glass having a high softening point formed on the entire surface of the ceramic substrate). On a matrix wires region 50 (first region) of the substrate 31 there are formed a plurality of parallel first wires 32 of Ti. Further, on the substrate 31, a semiconductor layer 33 is formed. This layer is formed continuously on the matrix wires region 50 and a photo-sensing elements region 52 (second region). A semiconductor layer 33 is, for example, a hydrogenated amorphous silicon (a—Si:H), namely, a layer including respectively more than 5 percent of H and more than 20 percent of Si, and formed as high resistance layer (intrinsic layer) having a specific resistance of more than $10^{10}\Omega$-cm, with thickness of 0.5 $\mu$m to 2 $\mu$m. At the surface of the semiconductor layer 33, low resistance layers (n+-layer) 34 of a—Si:H of the thickness of 0.005 $\mu$m to 0.5 $\mu$m doped with P are formed. The reason for providing the low resistance layer 34 is for providing a satisfactory ohmic contact with metals that will be formed on the semiconductor layer 33.

On the semiconductor layer of the photosensing elements region 52, first electrodes 35 are arranged in a predetermined alignment such as in a line. Also, second electrodes 36 are arranged in line on the semiconductor layer of the photo-sensing elements region 52. The second electrodes are commonly connected electrodes. Each of the first electrodes 35, faces a portion 36' of the second electrodes 36 to form an electrode pair, and the electrode pair together with the semiconductor layer 33 positioned therebetween form the photo-sensing element. The first electrodes 35 are respectively extended to form a plurality of second wires 37. Thus, the first and second electrodes 35, 36 and second wires 37 are attached to the semiconductor layer 33 by means of the low resistance layers 34 which is positioned therebetween. Each of the electrodes 35, 36 and wires 37 are made from Ti. The second wires 37 are connected to the first wires 32 at through holes C formed in the semiconductor layer 33 and low resistance layer 34.

Each of the second electrodes 36 has a plurality of gaps 54 corresponding to the photosensing elements. Each second electrode 36 has a plurality of portions 36' which from a group 56 of electrode portions facing an equal number of first electrodes 35 which thus also form similar groups 58. Each of the first electrodes 35 is connected jointly via first wires 32 to the corresponding member of the groups 58, namely, among those that have the same position in each of the groups.

The manufacturing steps are as follows:

At first, the first wires 34 of Ti are formed on the substrate 31 by sputtering or vapor deposition and the PEP (photo engraving process) for patterning. Then, the a—Si:H layer of the semiconductor layer 33 and the doped a—Si:H layer of the low resistance layer 34 are deposited by the masked plasma CVD method or the like. After forming the contact holes C by the RIE method, the first and second electrodes 35, 36 and the second wires 37 are made from the same layer of Ti by sputtering or vapor deposition and the following PEP process. Then, the portion of the low resistance layer 34 positioning at the photo-sensing elements region is etched.

Figure 1:
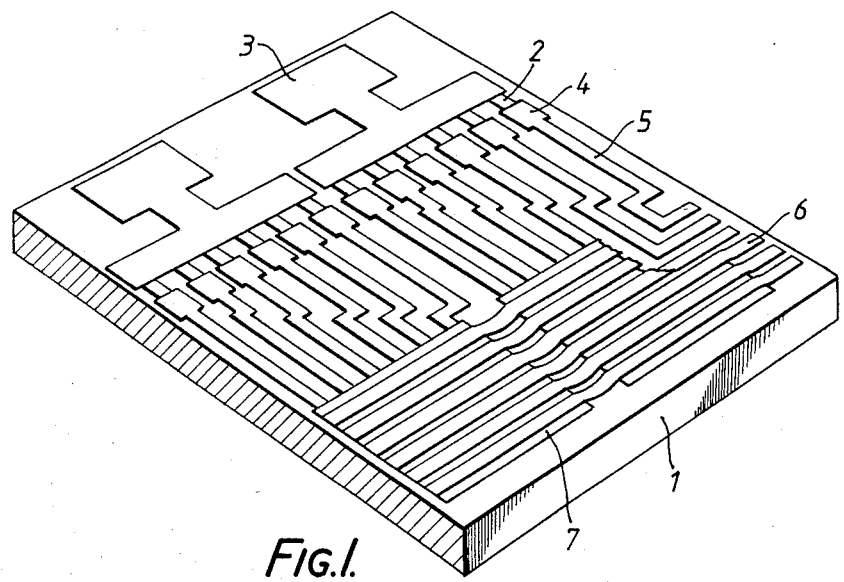
FIG. 1 is a diagram showing an image sensor of prior art.
Figure 2:
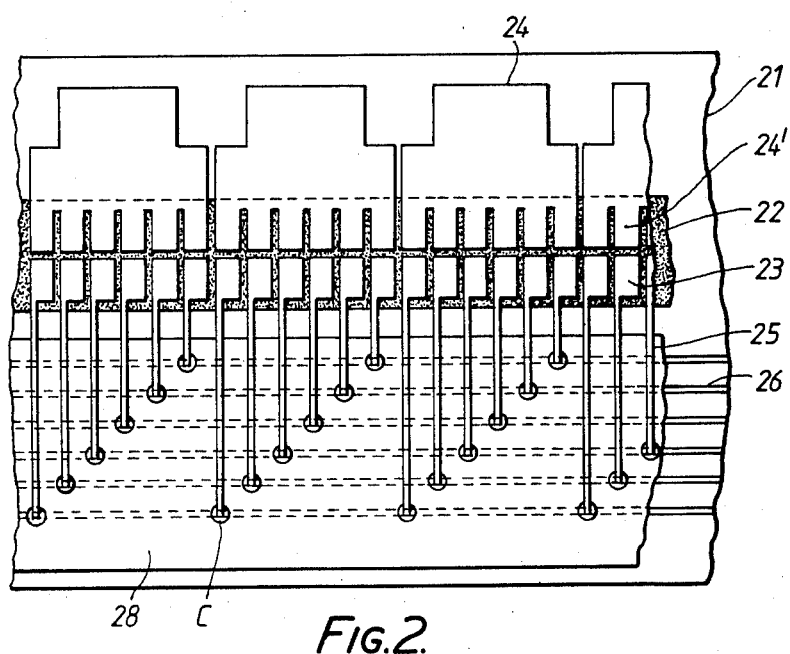
FIG. 2 is a diagram showing a plan view of an image sensor mode by the inventor prior to the present invention.

According to this embodiment, the electrodes 35, 36 and the wires 32, 37 are made by vapor deposition or sputtering and the PEP process and contact at through holes. Thus, the image sensor has a relatively small width. Further, the semiconductor layer 33 is formed over the entire surface of the regions 50 and 52. With this arrangement, one may improve the reliability of the image sensor as compared with the case of the band semiconductor of FIG. 2. In other words, the photosensing element array and the matrix wires can be formed close to each other, which contributes accordingly to the miniaturization of the image sensor. Further, there was a problem that the semiconductor layer is altered by the etchant in the etching process for the insulating layer. However, according to the embodiment of FIGS. 3a and 3b, such a problem will not occur.

Futhermore, it is possible to form the semiconductor layer in a state in which the substrate can be cleaned without adversely affecting the insulating layer. Moreover, in the state of forming the photoconductive layer, the substrate surface does not contain material such as an organic resin which would serve as the insulating layer, so that it is possible to form the semiconductor layer having high quality without being affected by the material.

Moreover, according to the embodiment, because of simplified manufacturing steps, high yield and lower cost can be achieved.

The electric isolation between the wires is performed by permitting incidence light from the surface of the manuscript to fall only on the photosensing elements region 52 of the semiconductor layer 33 and precludes incidence of light on other regions. However, if desired, a light shielding film may be made as denoted with the number 38 in FIGS. 3a and 3b. As for the light shielding film 38, a black epoxy resin or the like made by a screen printing method may be adopted.

Figure 4:
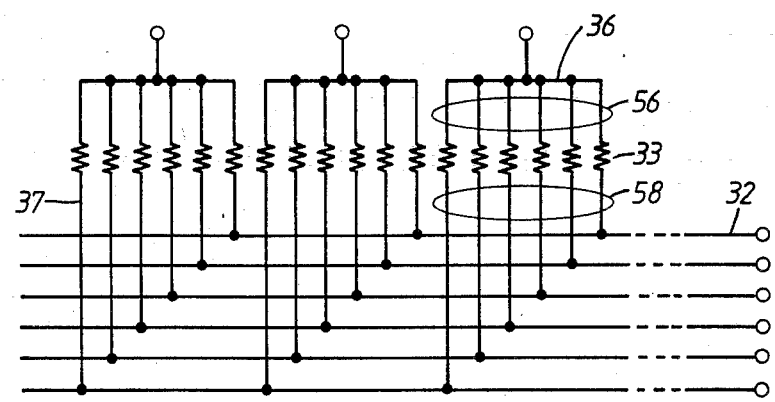
FIG. 4 is a diagram showing an equivalent circuit of an image sensor in FIG. 3a and FIG. 3b.

FIG. 4 is an equivalent circuit diagram for the image sensor shown in FIGS. 3a and 3b.

As may be seen from FIG. 4, it is possible to obtain image signals by selecting each group 56 of the photo-sensing element array by the successive application of a driving voltage to the second electrodes 36, and by repeating the operation of successively reading the signal in each group 58 that is obtained based on the change in the resistance in response to the intensity of incident light on the photoconductive layer, through the first wires 32.

Figure 5:
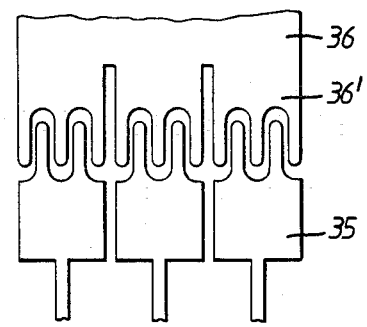
FIG. 5 is a diagram showing a plan view of electrodes attached to an image sensor as another embodiment of the invention.

Next, the embodiment of FIG. 5 of the present invention will be described. FIG. 5 is a diagram showing a plan view of electrodes attached to an image sensor as another embodiment of the invention. The same numerals are commonly used for the parts corresponding to those in FIGS. 3a and 3b.

As shown in this figure, as the opposing electrodes 35 and 36 in the photo-sensing element array, use may be made of comb-tooth-like electrodes, which permits one to enhance the sensitivity of the sensor.

Figure 6A:
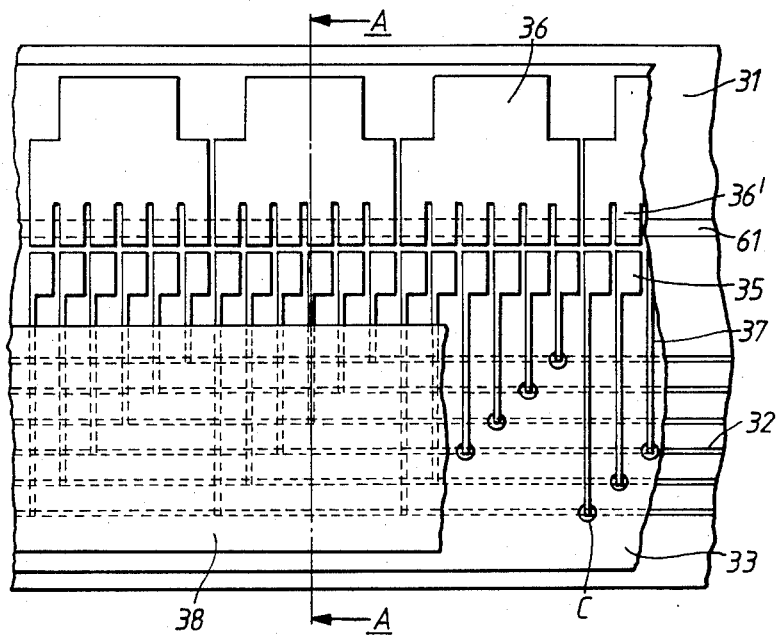
FIG. 6a is diagram showing a plan view of an image sensor of another embodiment of the invention.
Figure 6B:
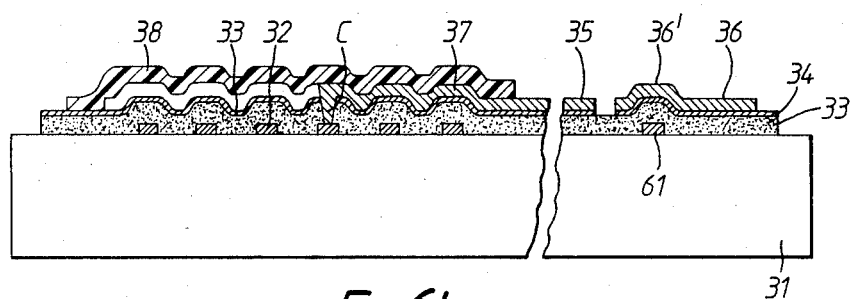
FIG. 6b is a diagram showing a cross-sectional view along line A—A of FIG. 6b.

FIG. 6a is a diagram showing a plan view of an image sensor of another embodiment of the invention, and FIG. 6b is a diagram showing a cross-sectional view along line A—A of FIG. 6a.

That is, semiconductor layer 33 such as an a—Si:H film has a property in which the specific resistance is increased and hence the sensitivity is decreased by being irradiated with light, a phenomena which is known as the Staebler-Wronski effect (also known as the photo-deterioration effect). The figure represents an embodiment which improves the adverse effects of photo-deterioration. In this embodiment, it becomes possible to recover the deterioration due to the photo-deterioration effect in the semiconductor layer 33 through passing of a current through a heating resistor 61.

This invention is not restricted to the embodiments described above.

For instance, although in the embodiment of FIGS. 3a and 3b the low resistance layer 34 is removed only in the region of the photo-sensing elements region, the low resistance layer 34 may also be removed from the remaining regions except for the regions beneath the first and second electrodes 35, 36 and the second wires 37. Namely, the low resistance layers 34 may be formed by etching away using the electrodes 35, 36 and the wires 37 as the etching masks.

In the embodiment described above, Ti is used as the material of the electrodes 35, 36 and the wires 32, 37, however, other metals such as Cr, Al, Ni, V, Mo, Mn, Au and Cu may be used instead of Ti.

This invention is not restricted to the specific embodiments described above. Other modifications and improvements of the invention may be apparent to one skilled in the art and the invention is intended to cover such modifications and improvements as defined by the appended claims.

What is claimed is:

1. An image sensor, comprising:
   a substrate;
   first wires formed in parallel on a first region of said substrate;
   a semiconductor layer formed on said first region covering said first wires and formed on a second region of said substrate adjacent said first region, said semiconductor layer being continuously formed on said substrate from said first region to said second region;
   a plurality of first electrodes having a predetermined alignment and electrically connected to said semiconductor layer in said second region, said plurality of first electrodes being formed on said semiconductor layer in said second region;
   a plurality of electrode portions electrically connected to said semi conductor layer of said second region and formed on said semiconductor layer in said second region, groups of said electrode portions each having a common second electrode formed on said semiconductor layer, said plurality of electrode portions having said predetermined alignment and positioned facing said first plurality of electrodes interposing a space between said plurality of first electrodes and said plurality of electrode portions wherein said electrode portions, said first electrodes and said semiconductor layer positioned therebetween comprise photo-sensing elements; and
   a plurality of second wires formed on said semiconductor layer and extended from said first electrodes, and second wires electrically connecting said first electrodes to said first wires via through holes formed in said semiconductor layer.

2. An image sensor according to claim 1, wherein said semiconductor layer comprises amorphous silicon.

3. An image sensor according to claim 1, further comprising a low resistance layer of doped amorphous silicon formed between said semiconductor layer and said first and second electrodes.

4. An image sensor according to claim 1 wherein said first electrodes are arranged in different positions forming groups corresponding in number to the number of groups of said electrode portions and wherein each of the first electrodes is connected jointly among said first electrodes that have the same position in each group of first electrodes, by means of said first wires.

5. An image sensor according to claim 1, wherein each of said second electrodes have gaps corresponding to said photo-sensing elements.

6. An image sensor according to claim 1, wherein said substrate is selected from the group of a glass substrate and a glazed ceramic substrate.

7. An image sensor according to claim 1, wherein said first and second electrodes and said first and second wires are made from metals selected from the group of Ti, Cr, Al, Ni, V, Mn, Au and Cu.

8. An image sensor according to claim 1 further comprising a light shielding layer formed on said first region, covering said first and second wires.

9. An image sensor according to claim 1, wherein said first and second electrodes are in the form of comb-tooth-like electrodes.

10. An image sensor according to claim 1, wherein said photo-sensing elements have a variable resistance corresponding to the intensity of incident light.

11. An image sensor according to claim 1 further comprising a heating resistor formed beneath said semiconductor layer in said second region.

12. An image sensor according to claim 1, wherein said semiconductor layer is continuously formed on said substrate over the entire first and second regions.

13. An image sensor, comprising:
a plurality of first wires formed in parallel on a first region of a substrate;
a semiconductor layer formed on said first region covering said first wires and formed on a second region of said substrate adjacent said first region;
a plurality of electrode pairs arranged in line, and electrically connecting and formed on said semiconductor layer of said second region, each of said electrode pairs and said semiconductor layer positioned therebetween forming a photo-sensing element; and
a plurality of second wires formed on said semiconductor layer, and electrically connected to said photo-sensing element and contacting said first wires at through holes formed in said semiconductor layer.

14. A method of manufacturing image sensors, comprising the steps of:
(i) forming a plurality of first wires in parallel on a first region of a substrate;
(ii) forming a semiconductor layer on said first region covering said first wires, and on a second region of said substrate, and said semiconductor layer having through holes corresponding to said first wires;
(iii) forming a conductive layer on said semiconductive layer; and
(iv) patterning said conductive layer to form a plurality of first electrodes, a plurality of second electrodes and a plurality of second wires, said first and second electrodes arranged in line, adjacent each other and connected to said semiconductor layer of said second region, each of said second electrodes adjacent a plurality of said first electrodes, said second wires extending from said first electrodes of said first region and contacting said first wires at said through holes in said semiconductor layer.

15. A method of manufacturing image sensors according to claim 14, further comprising the steps of:
(v) forming a low resistance layer of amorphous silicon on said semiconductor layer before said step iii); and
(vi) etching said low resistance layer positioning at least said photo-sensing elements after said step (iv).

16. A method of manufacturing image sensors according to claim 14, further comprising the step of
(v) forming a light shielding layer on said first region for covering said first and second wires.

17. A method of manufacturing image sensors according to claim 14, further comprising the step of
(v) forming a heating resistor on said second region before performing said step (i).

* * * * *